United States Patent
Ahmed et al.

(10) Patent No.: US 7,995,695 B2
(45) Date of Patent: Aug. 9, 2011

(54) DATA ALIGNMENT METHOD FOR ARBITRARY INPUT WITH PROGRAMMABLE CONTENT DESKEWING INFO

(75) Inventors: Yasser Ahmed, Macungie, PA (US); Xingdong Dai, Bethlehem, PA (US); Vladimir Sindalovsky, Perkasie, PA (US); Lane Smith, Easton, PA (US)

(73) Assignee: Agere Systems Inc., Allentown, PA (US)

( * ) Notice: Subject to any disclaimer, the term of this patent is extended or adjusted under 35 U.S.C. 154(b) by 888 days.

(21) Appl. No.: 11/969,440

(22) Filed: Jan. 4, 2008

(65) Prior Publication Data

US 2009/0175395 A1 Jul. 9, 2009

(51) Int. Cl.
*H04L 7/00* (2006.01)
*H04L 25/00* (2006.01)
*H04L 25/40* (2006.01)

(52) U.S. Cl. .............. 375/371; 375/372; 710/8; 710/22

(58) Field of Classification Search .................. 375/371, 375/372; 710/8, 22
See application file for complete search history.

(56) References Cited

U.S. PATENT DOCUMENTS

| 7,143,207 B2 * | 11/2006 | Vogt ............................... 710/31 |
| 7,286,572 B2 * | 10/2007 | Hornbuckle et al. ......... 370/537 |
| 2006/0273941 A1 | 12/2006 | Charath et al. |

OTHER PUBLICATIONS

"XAUI/XGXS Proposal," IEEE 802.3ae Task Force, PowerPoint Presentation Slides 1-26, Ottowa, ON May 23-25, 2000.

* cited by examiner

*Primary Examiner* — Ted M Wang (57) ABSTRACT

In an exemplary embodiment, a data alignment system comprises a First-In First-Out register (FIFO), a programmable pattern generator connected to the FIFO, and a controller connected to the programmable pattern generator and the FIFO. The FIFO is configured to provide data to or receive data from a first data lane of a serial data link having one or more lanes. Each data lane of the serial data link is configured to transmit a respective serial data stream. The programmable pattern generator is configured to generate a plurality of alignment symbols. The controller is configured to manage the alignment of the one or more data lanes of the serial data link and the insertion of a selected one of the plurality of alignment symbols into each of the serial data streams.

24 Claims, 5 Drawing Sheets

DATA ALIGNMENT METHOD FOR ARBITRARY INPUT WITH PROGRAMMABLE CONTENT DESKEWING INFO

FIELD OF THE INVENTION

The invention relates to electronic data transmission and more specifically relates to aligning data transmitted by a serial data link.

BACKGROUND

Serializer/Deserializer ("SERDES") devices are frequently used in high-speed communication networks to replace slow parallel buses with a single high speed lane. Serial transmission has the advantage of smaller silicon and board foot print and thus a lower cost. While serial data transmission avoids clock and data synchronization problems, some graphic intensive applications require a data link with a higher transmission speed than may be accomplished with purely serial transmission. To provide the desired bandwidth, some approaches recommend a hybrid approach where several serial lanes are bussed together to create a super "serial" link. For these suggested approaches, a system (such as a computer processor and related devices) writes data in parallel to a plurality of data lanes each configured with a First-In First-Out register ("FIFO"). Each write cycle in the FIFO is based on a system clock ("TWC"), and on the read side a SERDES device will read from each parallel FIFO based on a SERDES clock ("XCK"). The TWC and XCK are not always phase aligned, which may result in the transmitted data to be skewed or misaligned when received.

Attempts to eliminate data alignment issues include placing data alignment or data synchronization symbols in each of the parallel data lanes of a serial link. For example, some applications, such as Fibre Channel, encode data using an 8b/10b encoding method prior to transmission. When an 8b/10b encoding method is used, a special "comma" symbol is placed into the data path to align all FIFOs to the same pointer location. However, not all approaches or applications use 8b/10b encoding, and in an application without 8b/10b encoding, a lane deskewing FIFO cannot be used since there is no comma with which to align the data. Accordingly, if a system relying on data alignment of 8b/10b encoded data receives data that is not encoded as such, the system will not function correctly.

An improved method and apparatus for multi-channel synchronization of data is desired.

SUMMARY

In an exemplary embodiment, a data alignment system comprises a First-In First-Out register (FIFO), a programmable pattern generator connected to the FIFO, and a controller connected to the programmable pattern generator and the FIFO. The FIFO is configured to provide data to or receive data from a first data lane of a serial data link having one or more lanes. Each data lane of the serial data link is configured to transmit a respective serial data stream. The programmable pattern generator is configured to generate a plurality of alignment symbols. The controller is configured to manage the alignment of the one or more data lanes of the serial data link and the insertion of a selected one of the plurality of alignment symbols into each of the serial data streams.

In another exemplary embodiment, a data alignment method includes the steps of selecting a first alignment symbol of a plurality of alignment symbols available from a programmable pattern generator, starting a timer having a predetermined expiration time, and determining if the plurality of data lanes of the serial data link are aligned. If the data lanes are aligned before the expiration time of the timer, then setting a value in an alignment status done register. If the data lanes are not aligned before the expiration time of the timer, then setting a value in an alignment status error register.

DETAILED DESCRIPTION

Figure 1A:
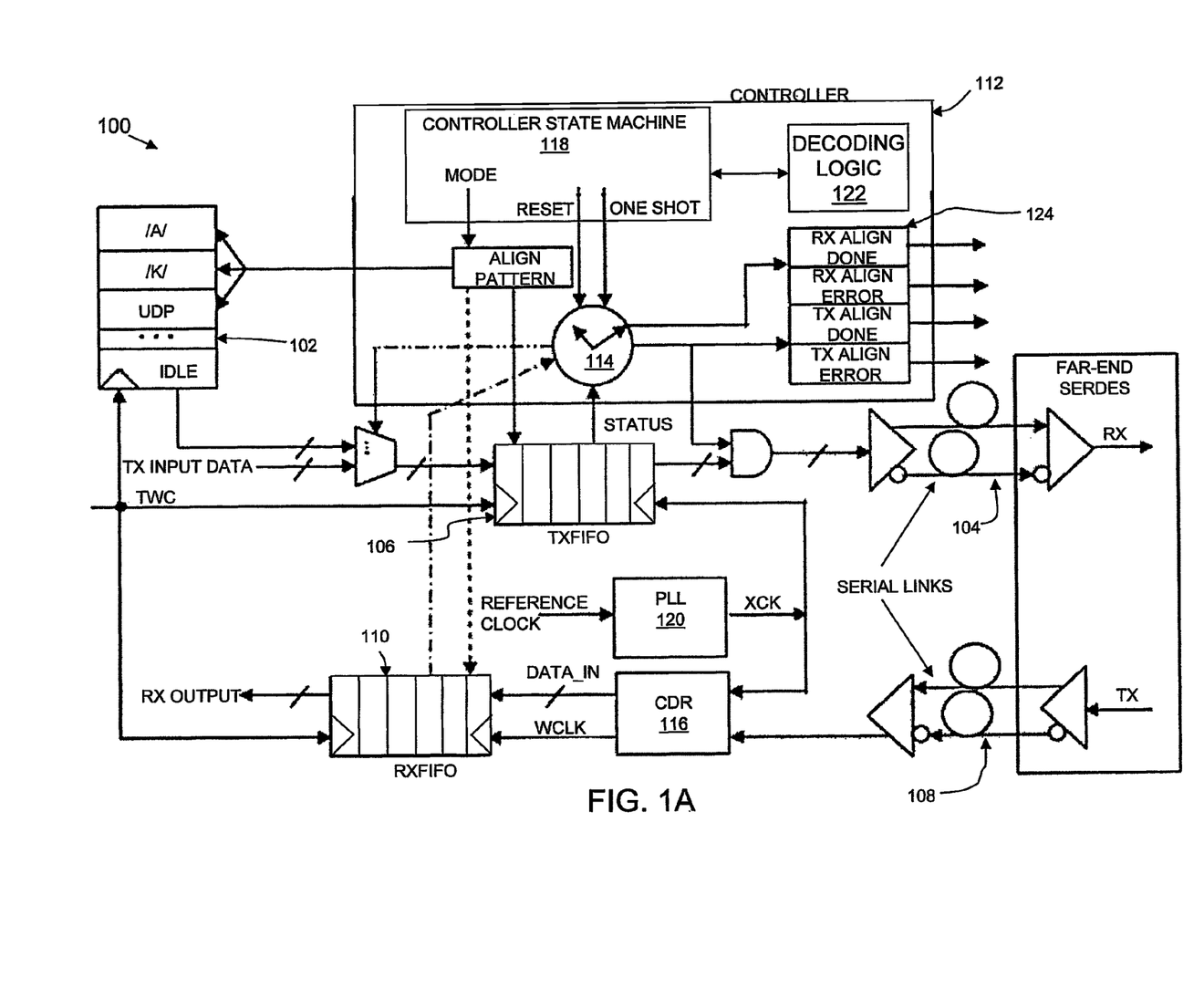
FIG. 1A is a diagram of a serial data transmission circuit in accordance with an exemplary embodiment.
Figure 1B:
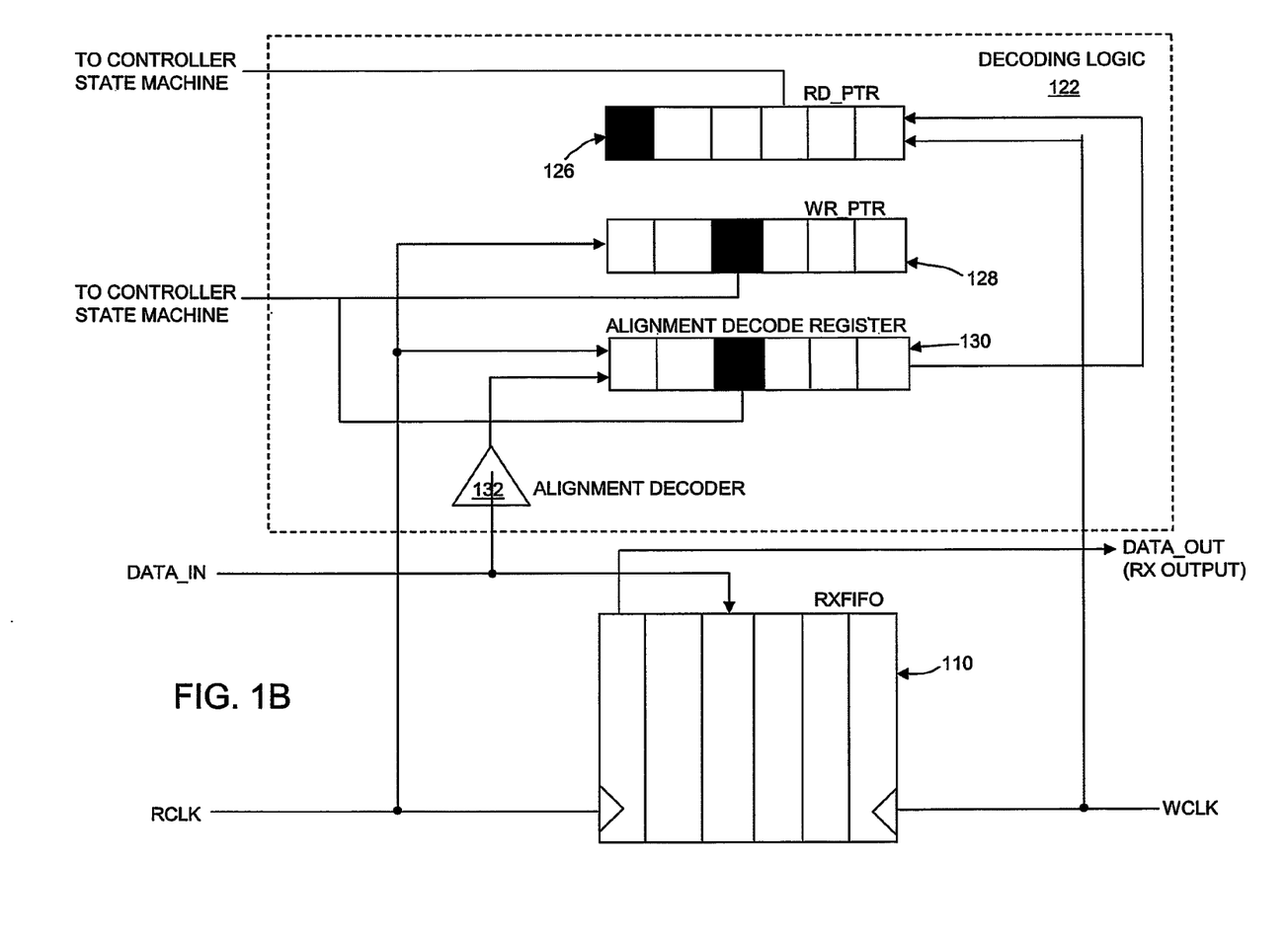
FIG. 1B is a diagram of decoding logic and registers in accordance with the exemplary embodiment of FIG. 1A.

With reference to FIGS. 1A and 1B, an improved system for deskewing serial data lanes with arbitrary inputs is now described. In the exemplary embodiment illustrated in FIG. 1A, serial data transmission circuit 100 includes a transmission ("TX") serial link 104 having a plurality of data lanes (not shown). Each data lane of TX serial link 104 is connected to a programmable lane deskewing FIFO ("TXFIFO") 106. Serial data transmission circuit 100 also includes a receiver ("RX") serial link 108. RX serial link 108 also has a plurality of data lanes (not shown) each connected to a programmable lane deskewing FIFO ("RXFIFO") 110. Additionally, RXFIFO 110 is connected to programmable pattern generator 102 through controller 112. TXFIFO 106 is also connected to programmable pattern generator 102.

As illustrated in FIGS. 1A and 1B, RXFIFO 110 includes one or more memory locations. In a preferred embodiment, RXFIFO 110 includes six memory locations; however, it is understood that RXFIFO 110 may be configured with fewer memory locations or more memory locations as needed. On the RX side of transmission circuit 100, data are received in parallel via the data transmission lanes of the RX serial link 108. Note that only one deskewing RXFIFO 110 and one programmable pattern generator 102 is shown to simplify the figure, and that in a preferred embodiment, each data lane of RX serial link 108 is configured with a respective RXFIFO 110. The deskewing of the transmitted data is performed inside each RXFIFO 110 and is accomplished by placing extra bytes, or repeating bytes, in each RXFIFO 110. The number of bytes repeated or placed into each data lane is dependent on the location of the alignment symbols in each RXFIFO 110. For example, if data in two data lanes are misaligned by 3 bytes, then the previously received byte may be repeated, or additional bytes may be added to the data stream inside RXFIFO 110, until the data at the output of RXFIFO 110 are aligned. The data are received by the RXFIFO 110 on the write clock cycle, WCLK, which is received by RXFIFO 110 from CDR circuit 116. CDR circuit 116 generates WCLK using the received data from RX serial link 108 and the reference output from the PLL circuit 120. Note that in a preferred embodiment the write clock cycle boundaries are every rising edge, but may be configured to be every falling edge or rising and falling edges of the clock signal. Each time an alignment symbol is written into RXFIFO 110, the character is decoded by alignment decoder 132 and aligned with the other lanes by the controller 112 as described below. Alignment on the RX side is aimed to correct link skews introduced between multiple RX serial links 108, for example, skews due to mismatches in trace length, material, cable, connectors, and the like.

On the TX side of transmission circuit 100, TXFIFO 106 is also illustrated in FIG. 1A as having multiple memory locations, although fewer or more memory locations may be implemented. TX serial link 104 may be configured with a plurality of lanes (not shown) by which data are transmitted in parallel. Note that only one deskewing TXFIFO 106 is shown, but in a preferred embodiment, each data lane of serial link 104 includes a TXFIFO 106. The deskewing of the transmitted data is performed inside TXFIFO 106 and is accomplished by placing one of a plurality of alignment symbols into each lane of TX serial link 104 so that the data may be aligned. Each SERDES macro can only support a certain number of serial links due to constraints on clock loading and macro size. However, if the data throughput requirement exceeds what a single macro can provide, then multiple macros may be implemented. A preferred implementation of multiple macros is a master-slave configuration. Data alignment on the transmit side is used to correct TWC clock skews between different data lanes. Data are input to TXFIFO 106 on the system clock cycle, TWC. Note that in a preferred embodiment the data are read on the rising edge of the TWC cycle, but may be read on the falling edge or on the rising and falling edges of the TWC signal. Each time an alignment symbol is written into TXFIFO 106 from programmable pattern generator 102, the data lane is aligned with the other data lanes as discussed in greater detail below. Once the data lanes are aligned, the data is synchronously transmitted across TX serial link 104.

In one present embodiment, controller 112 includes a state machine 118, status registers 124, watch dog timer 114, and decoding logic 122. Watch dog timer 114 is configured to signal the controller after a predetermined expiration time in which the alignment should be completed. In some embodiments, the expiration time is a configurable parameter that may be programmed by a user. As shown in FIG. 1B, decoding logic 122 is coupled to RXFIFO 110 and includes an alignment decoder 132, a read pointer register 126, a write pointer register 128, and an alignment decode register 130. Note that the connections from decoding logic 122 to RXFIFO 110 are not shown in FIG. 1A. In the exemplary embodiment illustrated in FIGS. 1A and 1B, controller 112 manages the deskewing of each data lane of the RX serial link 108 and TX serial link 104 by monitoring data passing through TXFIFO 106 and RXFIFO 110. Controller 112 may be configured to perform one-shot alignment, where the data are aligned only once, or continuous alignment, where the lanes are continuously deskewed or aligned.

If the alignment pattern ("PAT") used within either TXFIFO 106 and RXFIFO 110 is known, e.g., single-pattern alignment, then the controller may select the desired pattern from the one or more patterns available from programmable pattern generator 102. Table 1, below, is an exemplary, but not exhaustive, list of patterns with which programmable pattern generator 102 may be programmed. For example, in single-pattern alignment for a Fibre Channel application, controller 112 will set the programmable pattern generator 102 to Mode 0. In this mode, programmable pattern generator 102 will generate and place the /K/ of the K28.5 sync symbol into each of the data streams being transmitted by TX serial link 104. Alternatively, if the data are being received, the received data in the RXFIFO 110 are analyzed to see if an alignment symbol that matches the alignment symbol generated by programmable pattern generator 102 appears within the data stream. In this manner, controller 112 uses the programmable pattern generator 102 as a data memory from which controller 112 can retrieve an alignment symbol to compare with the data within RXFIFO 110. Note that programmable pattern generator 102 may be programmed with a number, 'n', of alignment patterns, where 'n' may be any positive integer.

TABLE 1

Lane Deskew Mode Control, Pattern and Applications

| Mode | Pattern | Application |
| --- | --- | --- |
| 0 | /K/ | Fibre Channel |
| 1 | /A/ | XAUI |
| 2 | Any | User-defined pattern (UDP) |
| 3 | All of above | Blind (cycle through Fibre channel, XAUI and UDP) |

Blind pattern alignment is typically used when the alignment symbol in the data stream is not known. In this setting, controller 112 will test some or all of the programmed alignment patterns available in programmable alignment generator 102. For example, controller 112 may initially set programmable pattern generator 102 to Mode 0 and compare data received in each RXFIFO 110 of RX serial link 108 with the /K/ of the K28.5 alignment symbol for the XAUI application generated by programmable pattern generator 102. If the /K/ is not found, then controller 112 may increment the mode from '0' to '1' and again compare the data received in each RXFIFO 110 to the /A/ sync symbol generated by programmable pattern generator 102. In this manner, controller 110 may cycle through each of the alignment symbols stored in the pattern generator 102 until it finds the appropriate data alignment symbol for the application. If the appropriate data alignment symbol is not found for the application at the expiration of the watchdog timer 114, then the alignment process is aborted.

In an exemplary embodiment, programmable pattern generator 102 is configured to perform multiple functions. In applications where data alignment symbols are embedded in the data stream, programmable pattern generator 102 facilitates data alignment by providing an alignment symbol with which controller 112 compares the received data in each data lane of RX serial link 108 and the TX serial link 104. Programmable pattern generator 102 can also be configured to facilitate data alignment between several data lanes of either the TX serial link 104 or the RX serial link 108 in applications that do not provide alignment symbols. On the TX side, the programmable pattern generator 102 facilitates the data alignment by placing a data alignment symbol in each data lane so that the data may be aligned before transmission across several SERDES macros in a master-slave configuration. If the SERDES device at the far end of the serial data link is of a similar configuration, then once the data alignment is completed, the far-end SERDES can utilize the alignment symbols to perform RX side data alignment to correct link and receiver data skewing. In an exemplary embodiment, programmable pattern generator 102 operates on the system clock, TWC. However, in some embodiments where RX side data alignment is performed without embedded alignment symbols, programmable pattern generator 102 may be configured to run on WCLK by multiplexing TWC and WCLK.

Running the programmable pattern generator 102 on WCLK will remove the dependency of the receiver lane deskewing on the transmit lane deskewing making them two independent events.

As described above, programmable pattern generator 102 may be configured to generate a plurality of alignment symbols including the traditional "comma" symbol used in 8b/10b encoding to take advantage of existing FIFO designs. However, if a data stream does not contain an alignment symbol, the programmable pattern generator 102 is further configured to place any of a plurality of alignment symbols into the data lanes to facilitate data alignment by controller 112. Additionally, programmable pattern generator 102 may be programmed by a user to output a user-defined pattern ("UDP") for increased flexibility. The ability of pattern generator 102 to be programmed with a plurality of alignment symbols advantageously enables the alignment of data that was input arbitrarily, e.g., transmitted without an alignment symbol.

Figure 2:
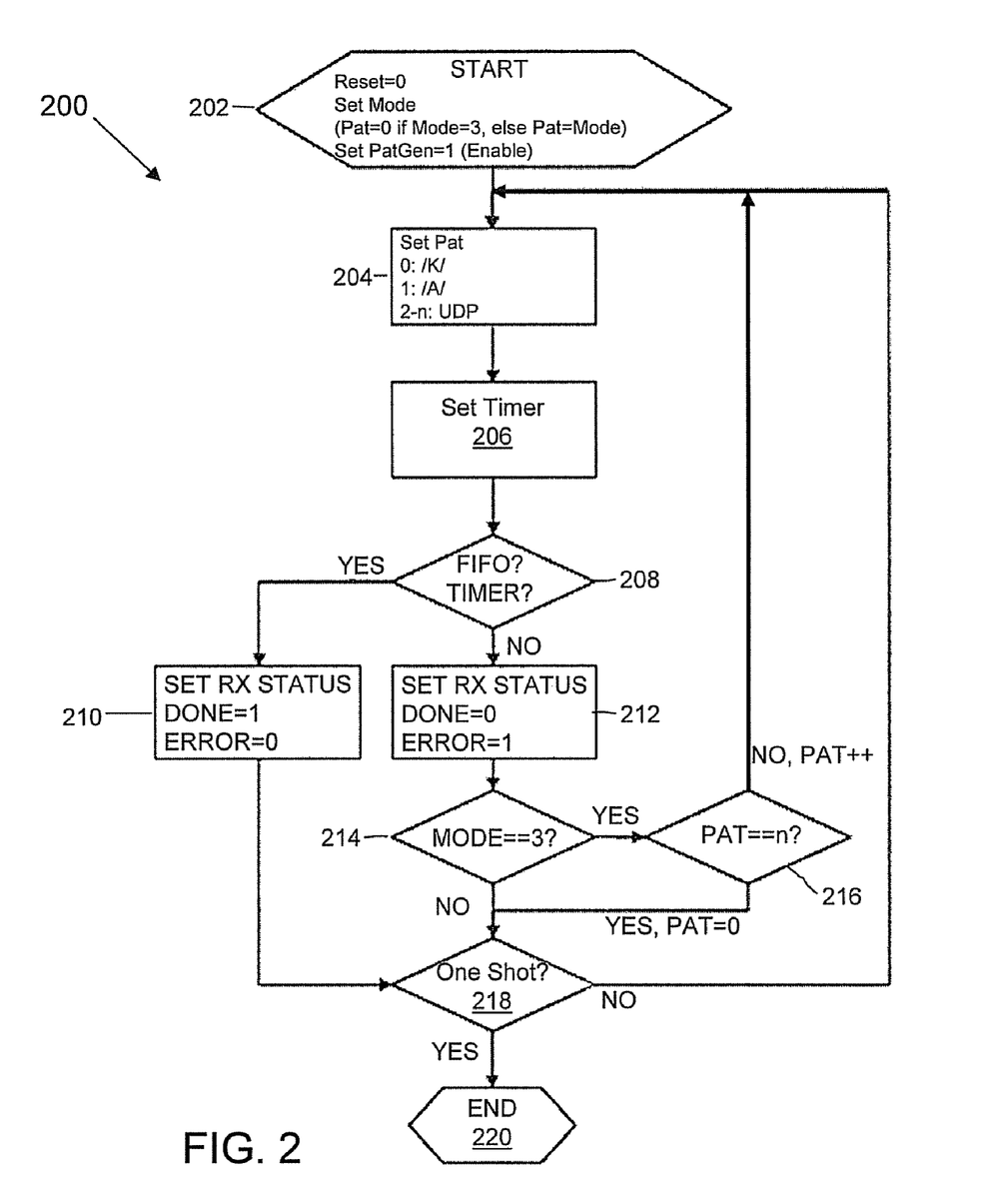
FIG. 2 is a flow diagram of a receiver lane deskewing operation in accordance with the exemplary embodiment illustrated in FIGS. 1A and 1B.

FIG. 2 is a flow diagram of the controller state machine 118 aligning a data lane of the RX serial link 108 in accordance with the exemplary embodiment illustrated in FIGS. 1A and 1B. The alignment method begins at block 202 when controller 112 turns on the programmable pattern generator 102 by setting the PatGen bit to '1'. At block 204, controller 112 selects the desired alignment pattern with which the controller will compare the received data in the data lanes of RX serial link 108. For example, controller 112 may set the PAT=0 for Fibre Channel application or PAT=1 for an XAUI application. After setting the desired alignment pattern, controller 112 starts its watch dog timer 114 at block.

At this point, the data alignment process begins. State machine 118 of controller 112 will select one of the data lanes of the RX serial link 108 and determine whether a data alignment symbol, such as a comma or a /K/, has been received in the RXFIFO 110. If a data alignment symbol has not been received in the selected data lane, then state machine 118 will check another RXFIFO 110 connected to another data lane to see if an alignment symbol has been received. Upon receiving an alignment symbol within the RXFIFO 110, an alignment decode register bit is written to a corresponding location in the alignment decode register 130 on the rising edge of TWC for RX side alignment or WCLK for write-side alignment. Once an alignment symbol is received in each of the data lanes of RX serial link 108, controller 112 determines whether a data alignment symbol is to be read on the next read cycle by analyzing the read pointer locations in each of the data lanes. If a data alignment symbol is to be read on the next read cycle and there is a data alignment symbol in each of the data lanes, then the position of the alignment decode register 130 is copied to the read pointer register 126, and the read pointer location of the selected data lane is moved to the corresponding location of the data alignment symbol. Once each of the read pointers are moved to read from the same location, the data is synchronously read.

At decision block 208, controller 112 receives a signal from the watch dog timer 114 to check the alignment status of the RX serial data link 108. If the data lanes of RX serial link 108 are aligned, e.g., the read pointers for all lanes have been advanced or moved so the data will be sequentially read, then at block 210 controller 112 sets the RX status done register to '1' and the error register to '0' in status registers 124. After the status done register in status registers 124 is set to '1', controller 112 checks to see if it is set to perform one-shot alignment. If set to perform one-shot alignment, then the alignment process finishes at block 220. However, if the one-shot alignment is not selected, then controller 112 is set to continuously align the data lanes. In an exemplary embodiment, the continuous alignment mode is typically used to correct misalignment in high error rate conditions, such as start-up. Repeatedly sending alignment symbols at regular intervals can be used to reinforce data alignment decisions in training sequences. In continuous alignment mode, controller 112 will reset watch dog timer 114 and repeat the steps of blocks 204 to 218. Alternatively, if the data lanes of RX serial link 108 are not aligned at the expiration of watch dog timer 114, then at block 212 controller 112 sets a data alignment error status register to '1' and a done status register in status registers 124 is set to '0'. Setting an error register in status registers 124 provides feedback to an upper layer or system controller, which may be implemented to probe or debug the error.

At decision block 214, controller 112 determines if it is in blind pattern alignment mode. If the controller 112 is in blind pattern alignment mode, then at decision block 216 it determines if it has tested each of the available alignment patterns by comparing the number of alignment patterns tested with the maximum number of patterns, 'n', stored in programmable pattern generator 102. If all available alignment patterns have been tested, then the controller 112 sets PAT to '0' and moves to decision block 218. However, if the number of alignment patterns tested is not equal the number of alignment patterns available in programmable pattern generator 102, then the pattern number, PAT, is incremented and the alignment process restarts at block 204.

At decision block 218, controller 112 determines if it is set for one-shot alignment. If one-shot alignment is selected, then the pattern alignment process ends at block 220. However, if one-shot alignment is not selected, then the controller 112 is set for continuous alignment and restarts the alignment process beginning at block 204.

Figure 3:
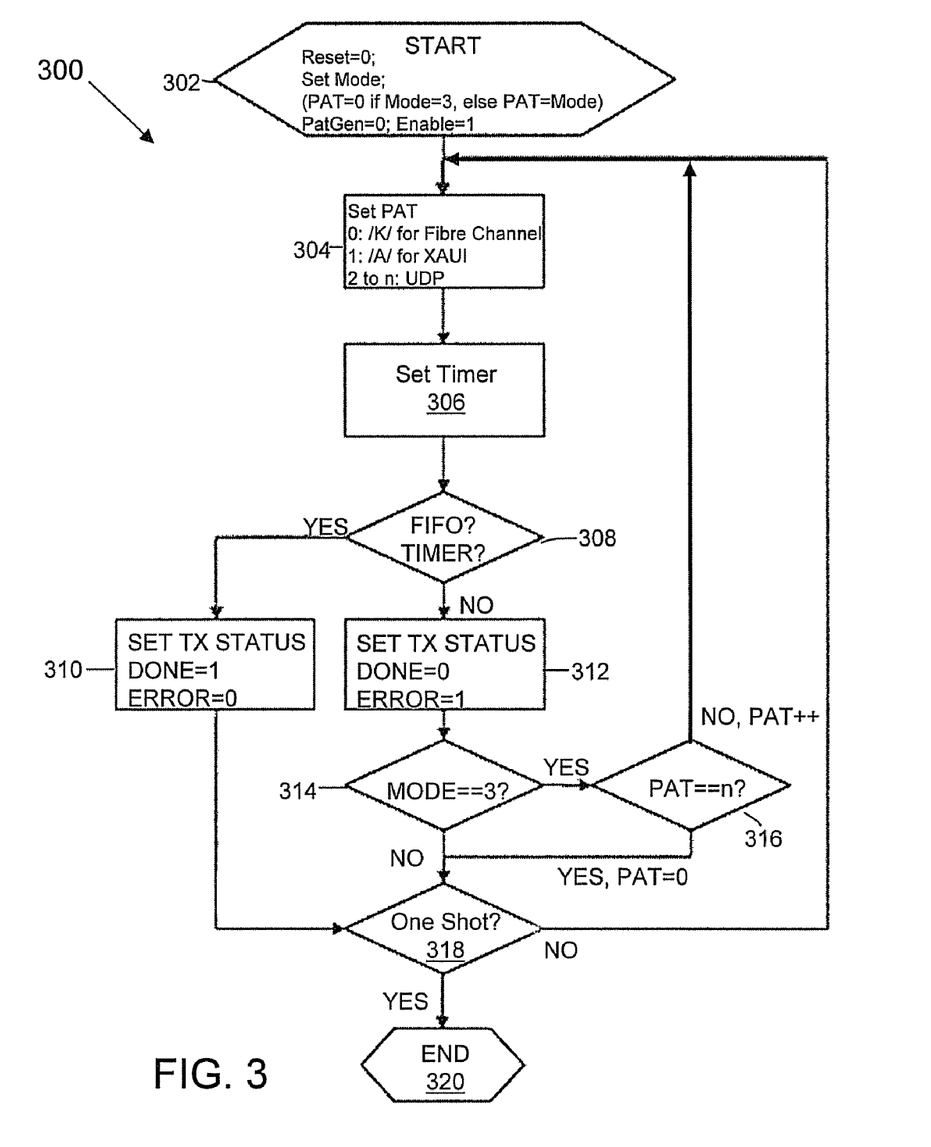
FIG. 3 is a flow diagram of a transmission lane deskewing operation in accordance with the exemplary embodiment illustrated in FIGS. 1A and 1B.

On the transmission side, if the data to be transmitted are expected to include an alignment symbol, then the flow of the controller state machine 118 is similar to that described above for the RX side, except that a TX status register is set. With reference to FIG. 3, an exemplary deskewing operation for the TX serial link 104 is now described. The deskewing operation of TX serial link 104 begins at block 302 with controller 112 turning on the programmable pattern generator 102 by setting PatGen=1. At block 304, controller 112 selects the desired alignment pattern (e.g., PAT=1 for Fibre Channel), and at block 306 the watch dog timer 114 is set by controller 112.

At this point, the data alignment process begins. Controller 112 selects one of the data lanes of the TX serial link 104 and determines whether a data alignment signal, such as a comma, is received in the respective TXFIFO 106. If a data alignment signal has not been received in the data lane, then controller 112 will check the TXFIFO 110 in another data lane of TX serial link 104. Upon receiving an alignment symbol within the TXFIFO 106 in a data lane, an alignment decode register bit is written to a corresponding location in the alignment decode register 130. For example, the controller 112 writes the data into the proper location of TXFIFO 106 and writes the alignment character into the proper location of the alignment decode register 130. These steps are repeated until all data lanes of the TX serial link 104 are aligned or the watch dog timer 114 expires.

At decision block 308, controller 112 receives a signal from watch dog timer 114 and determines if the data lanes of TX serial link 104 are aligned. If the data lanes of TX serial link 104 are aligned, e.g., the read pointers for all lanes have been advanced or moved to the same location, then at block 310 the TX status register is set to '1' and the error register is set to '0' in status registers 124 by controller 112. After the status done register is set to '1', the controller state machine 118 moves to decision block 318.

Alternatively, if the data lanes of TX serial link 104 are not aligned at the expiration of watch dog timer 114, then controller 112 sets a data alignment error status register to '1' and a done register in status registers 124 is set to '0' at block 312. Setting a value indicating an error register in status registers 124 provides feedback to an upper layer or system controller, which may be implemented to probe or debug the error. The process continues to decision block 314 where controller 112 determines if it is set for blind pattern alignment. If the controller 112 is set for blind pattern alignment, then, at decision block 316, controller 112 determines if each of the available alignment patterns have been tested by comparing the current number of tested patterns with the maximum number of patterns, 'n', stored in programmable pattern generator 102. If all patterns have been tested, then the controller sets PAT=0 and moves to decision block 318. However, if the number of alignment patterns tested does not equal the number of alignment patterns available from programmable pattern generator 102, then the PAT value is incremented and the alignment process restarts at block 304.

At decision block 318, controller 112 determines if it is set to one-shot alignment mode. If one-shot alignment has been selected, then the pattern alignment ends at block 320, but if one-shot alignment is not selected, then controller 112 is set to continuously align data and restarts the alignment process beginning at block 304.

Figure 4:
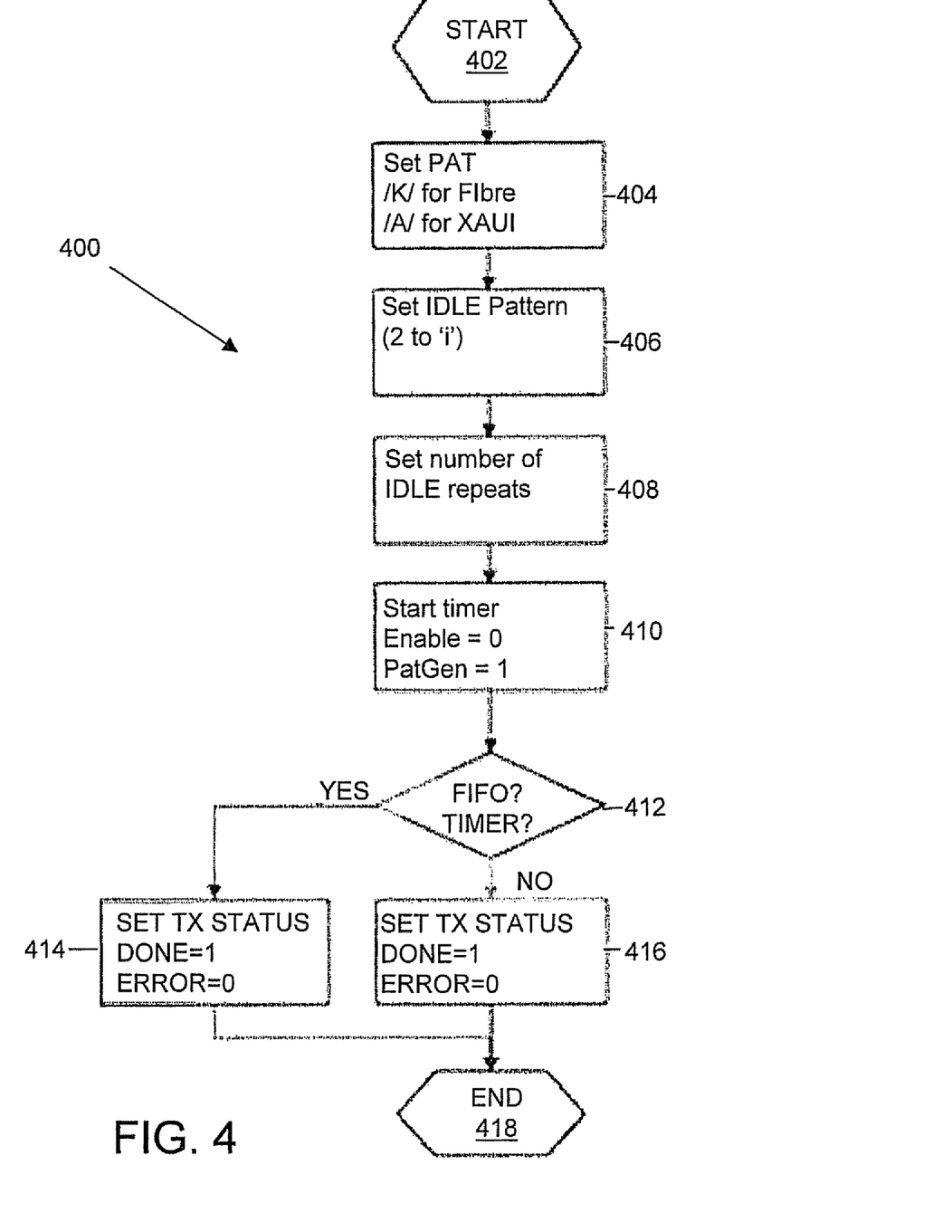
FIG. 4 is a flow diagram of a transmission lane deskewing operation with a pattern generator in accordance with the exemplary embodiment illustrated in FIGS. 1A and 1B.

Serial data transmission circuit 100 is also configured to align and deskew data that are not encoded or, if they are encoded, are not encoded using the 8b/10b encoding scheme. FIG. 4 is a flow diagram for the controller state machine 118 aligning data arbitrarily input (e.g., no encoding scheme) into the TX serial link 104 in accordance with the exemplary embodiment illustrated in FIGS. 1A and 1B. The method starts at block 402, and at block 404, controller 112 sets the desired alignment symbol (e.g., /K/ for Fibre or /A/ for XAUI). At block 406, controller 112 sets the idle pattern, IDLE. The IDLE is a user-defined pattern starting from 2 and running to 'i'. It is preferable to use an IDLE pattern that is different than the alignment pattern, PAT, to reduce the likelihood of misaligning the data.

At block 408, the number of IDLE pattern repeats is programmed. It is preferred to set the number of IDLE repeats to a value that is greater than the number of memory locations of TXFIFO 106 to ensure that a maximum of one alignment pattern can be within the TXFIFO 106 at any one time. Ensuring a maximum of one alignment pattern per lane at any one time prevents a false alignment of data by preventing confusion as to which alignment symbol the read pointer should be pointing.

At block 410, data alignment begins. At the start of the alignment, controller 112 initializes the programmable pattern generator 102 by setting PatGen to '1' and starting its watch dog timer 114. In this configuration, programmable pattern generator 102 continuously outputs alternating alignment patterns and non-alignment IDLE patterns to align the data in each of the data lanes of TX serial link 104. In some embodiments, controller 112 may gate off the output of TXFIFO 106 to prevent the transmission of data. At decision block 412, the controller 112 determines if the data in each of the lanes of TX serial link 104 are aligned. If data alignment is achieved, then at block 414 the controller 112 will switch into the normal data transmission mode, turn off watch dog timer 114, and set a data alignment done status register to '1' in registers 124. However, if controller 112 determines at decision block 412 that the data are not aligned at the expiration of watch dog timer 114, controller 112 switches into the normal transmission mode at block 416 by turning off watch dog timer 114 and setting a data alignment error status register to '1' in status registers 124. The setting of the data alignment error register to '1' signals an upper layer or system controller to probe and debug the error. The setting of the data alignment error register also replicates the pattern generator at the inputs of the RXFIFO 110.

In some exemplary embodiments, a programmable pattern generator 102 is not needed in the data transmission lanes since the transmission data streams are expected to contain alignment symbols. However, if the TX data stream cannot guarantee the inclusion of an alignment symbol, then the programmable pattern generator 102 in the transmit path should be turned on (PatGen=1), and the programmable pattern generator 102 in the RX lane should be enabled for deskewing. When the transmission data stream cannot guarantee the inclusion of alignment symbols, a convenient configuration is to set the first two pattern words as /A/ and /K/ and the rest of the pattern words as user-defined patterns so that controller 112 will first search for the /A/ and /K/ symbols, which are more frequently used than user-defined patterns.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A data alignment system, comprising:
    a First-In First-Out register (FIFO) configured to provide data to or receive data from a first data lane of a serial data link having one or more data lanes, each data lane of the serial data link transmitting a respective serial data stream;
    a programmable pattern generator connected to the FIFO, wherein the programmable pattern generator is configured to generate a plurality of alignment symbols; and
    a controller connected to the programmable pattern generator and the FIFO, wherein the controller is configured to manage the alignment of the one or more data lanes of the serial data link and the insertion of a selected one of the plurality of alignment symbols into each of the serial data streams.

2. The data alignment system of claim 1, wherein the controller includes a timer configured to signal the controller after an expiration time.

3. The data alignment system of claim 2, wherein the controller is configured to set a value in the one or more registers if data alignment is not achieved at the expiration of the alignment time to signal an upper level application to debug the error.

4. The data alignment system of claim 1, wherein the programmable pattern generator is further configured to generate a number of idle patterns for insertion into each of the serial data streams.

5. The data alignment system of claim 4, wherein the number of idle patterns is at least equal to a number of memory locations in the FIFO.

6. The data alignment system of claim 1, wherein the programmable pattern generator is programmed with at least one user-defined alignment pattern or symbol.

7. The data alignment system of claim 1, wherein the at least one alignment symbol is selected from the group consisting of a comma, an /A/ of the K28.3 sync symbol, and a /K/ of K28.5 sync symbol.

8. The data alignment system of claim 1, wherein the controller is further configured to compare each of the plurality of alignment symbols stored in the programmable pattern generator with data in the FIFO.

9. A data alignment method for a serial data link having a plurality of data lanes, comprising the steps of:
 (a) selecting a first alignment symbol from a plurality of alignment symbols available from a programmable pattern generator;
 (b) starting a timer having a predetermined expiration time;
 (c) determining if the plurality of data lanes of the serial data link are aligned;
 (d) if the data lanes are aligned before the expiration time of the timer, setting a value in an alignment status done register, and
 (e) if the data lanes are not aligned before the expiration time of the timer, setting a value in an alignment status error register.

10. The data alignment method of claim 9, further comprising the steps of:
 (f) selecting a second alignment symbol from the plurality of alignment symbols available from the programmable pattern generator;
 (g) resetting the timer; and
 repeating steps (c) through (e).

11. The data alignment method of claim 9, further including the step of:
 repeating steps (a) through (e) if a controller is configured in a continuous alignment mode.

12. The data alignment method of claim 9, wherein the timer is a watch dog timer configured to signal the controller after the predetermined expiration time.

13. The data alignment method of claim 9, wherein the first alignment symbol is selected from the group consisting of a comma, a /K/ of the K28.5 sync symbol, and an /A/ of the K28.3 alignment symbol.

14. The data alignment method of claim 9, further comprising receiving a selection of the first alignment symbol from a user.

15. The data alignment method of claim 9, wherein the value in an alignment status error register is set to signal an upper level application to debug the error.

16. The data alignment method of claim 9, wherein the predetermined expiration time is programmable parameter.

17. The data alignment method of claim 9, wherein the determining step further includes:
 comparing data received in each of the plurality of data lanes with the selected alignment symbol.

18. A machine readable storage medium encoded with program code, wherein when the program code is executed by a processor, the processor performs a method comprising the steps of:
 (a) selecting a first alignment symbol from a plurality of alignment symbols available from a programmable pattern generator;
 (b) starting a timer having a predetermined expiration time;
 (c) determining if a plurality of data lanes of a serial data link are aligned;
 (d) if the data lanes are aligned before the expiration time of the timer, setting an alignment status done register, and
 (e) if the data lanes are not aligned before the expiration of the timer, setting a value in an alignment status error register.

19. The machine readable storage medium of claim 18, further comprising the steps of:
 (f) selecting a second alignment symbol from the plurality of alignment symbols available from the programmable pattern generator;
 (g) resetting the timer; and
 repeating steps (c) through (e).

20. The machine readable storage medium of claim 18, further comprising the step of:
 repeating steps (a) through (e) if a controller is configured in a continuous alignment mode.

21. The machine readable storage medium of claim 18, wherein the timer is a watch dog timer configured to signal the controller after the expiration time.

22. The machine readable storage medium of claim 18, wherein the first alignment symbol is selected from the group consisting of a comma, a /K/ of the K28.5 sync symbol, and an /A/ of the K28.3 alignment symbol.

23. The machine readable storage medium of claim 18, wherein the predetermined expiration time is a programmable parameter.

24. The machine readable storage medium of claim 18, wherein the determining step includes:
 comparing data received in each of the plurality of data lanes with the alignment symbol available from the programmable pattern generator.

\* \* \* \* \*